United States Patent [19]

Fillion et al.

[11] Patent Number: 5,455,459

[45] Date of Patent: * Oct. 3, 1995

[54] RECONSTRUCTABLE INTERCONNECT STRUCTURE FOR ELECTRONIC CIRCUITS

[75] Inventors: Raymond A. Fillion, Schenectady; Herbert S. Cole, Jr., Burnt Hills, both of N.Y.

[73] Assignee: Martin Mariettea Corporation, Bethesda, Md.

[*] Notice: The portion of the term of this patent subsequent to Mar. 1, 2011 has been disclaimed.

[21] Appl. No.: 250,329

[22] Filed: Jun. 9, 1994

Related U.S. Application Data

[63] Continuation of Ser. No. 858,452, Mar. 27, 1992, abandoned.

[51] Int. Cl.[6] .................................................. H01L 23/02
[52] U.S. Cl. ...................... 257/760; 257/762; 257/211; 174/262; 439/68
[58] Field of Search ............................. 257/758, 759, 257/760, 700, 211

[56] References Cited

U.S. PATENT DOCUMENTS

| | | | |
|---|---|---|---|
| 3,834,793 | 9/1974 | McConnell et al. | 350/160 R |
| 4,058,430 | 11/1977 | Suntola et al. | 156/611 |
| 4,618,878 | 10/1986 | Aoyama et al. | 257/760 |
| 4,783,695 | 11/1988 | Eichelberger et al. | 357/65 |
| 4,884,122 | 11/1989 | Eichelberger et al. | 357/71 |
| 4,918,811 | 4/1990 | Eichelberger et al. | 29/840 |
| 4,960,613 | 10/1990 | Cole et al. | 427/53.1 |
| 4,988,412 | 1/1991 | Liu et al. | 204/15 |
| 5,108,825 | 4/1992 | Wojnarowski et al. | 428/209 |
| 5,127,998 | 7/1992 | Cole et al. | 205/135 |
| 5,157,589 | 10/1992 | Cole et al. | 361/414 |
| 5,291,066 | 3/1994 | Neugebauer et al. | 257/759 |

OTHER PUBLICATIONS

"Atomic Layer Epitaxy", Colin H. L. Goodman, Markus V. Pessa, J. Appl. Phys. 60(3), 1 Aug. 1986, pp. R65–R81.
"Atomic Layer Epitaxy", Tuomo Suntola, Jaakko Hyvarinen, Ann. Rev. Mater. Sci. 1985, pp. 177–195.
"Laser–Induced Selective Copper Deposition on Polyimide", H. S. Cole, Y. S. Liu, J. W. Rose, R. Guida, Appl. Phys. Lett. 53(21), 21 Nov. 1988, pp. 2111–2113.
"Deposition of Refractory Metal Films by Rare–Gas Halide Laser Photodissociation of Metal Carbonyls", Diane K. Flynn, Jeffrey I. Steinfeld, J. Appl. Phys. 59(11), 1 Jun. 1986, pp. 3914–3917.
"Patterned Photonucleation of Chemical Vapor Deposition of Al by UV–Laser Photodeposition", J. Y. Tsao, D. J. Ehrlich.
"Ultraviolet Photodecomposition for Metal Deposition: Gas Versus Surface Phase Processes", Thomas H. Wood, J. C. White, B. A. Thacker, Appl. Phys. Lett. vol. 42, No. 5, Mar. 1983, pp. 408–410.

Primary Examiner—Robert P. Limanek
Assistant Examiner—David B. Hardy
Attorney, Agent, or Firm—Brian J. Rees; Geoffrey H. Krauss

[57] ABSTRACT

A reconstructible electrical circuit module includes a substrate, at least one electrical circuit component and an electrical interconnection structure. The electrical interconnection structure includes at least one multiple ply sequence stacked over the component and substrate in which the portion of the module underlying a ply in the electrical interconnection structure is substantially unimpairable by a process for removing that ply.

10 Claims, 7 Drawing Sheets

RECONSTRUCTABLE INTERCONNECT STRUCTURE FOR ELECTRONIC CIRCUITS

This is a continuation of application Ser. No. 07/858,452, filed Mar. 27, 1992, now abandoned.

RELATED APPLICATION

This application is related to U.S. Pat. No. 05,291,066, entitled "Moisture Proof Electrical Circuit High Density Interconnect Module and Method for Making Same," by Neugebauer et al., filed Nov. 11, 1991, which is herein incorporated by reference.

BACKGROUND OF THE INVENTION

1. Field of the Invention

The invention is generally directed to packaged electrical circuit components, such as very large scale integrated circuit (VLSI) chips, situated in a high density interconnect (HDI) structure. More particularly, the invention relates to an electrical circuit module that is repairable or reconstructible.

2. Background Information

HDI structures of the type mentioned above are shown and described in U.S. Pat. No. 4,783,695, "Multichip Integrated Circuit Packaging Configuration and Method," issued Nov. 8, 1988, and in U.S. Pat. No. 4,918,811, "Multichip Integrated Circuit Packaging Method," issued Apr. 24, 1990, both assigned to the the assignee of the present invention and herein incorporated by reference.

Manufacturing yield is a significant problem affecting production of electrical circuit modules, including those incorporating HDI structures. To improve yield, a method has been devised for removing and replacing the entire electrical interconnection structure overlying the electrical circuit components, as disclosed in U.S. Pat. No. 4,884,122, "Method and Configuration for Testing Electrical Circuits and Integrated Circuit Chips Using a Removable Overlay Layer," filed Aug. 5, 1988, assigned to the assignee of the present invention, and herein incorporated by reference.

A typical HDI structure comprises a plurality of multiple ply sequences successively stacked over the electrical circuit components and substrate, each sequence including at least a metal layer for electrical connections and an underlying dielectric polymer film for electrical insulation. Thus, refabrication of the entire electrical interconnection structure, which comprises a substantial portion of the module, may be time consuming, wasteful and expensive, particularly where a fault in the module or an engineering design change may affect only one multiple ply sequence or even one ply in the sequence.

The latter patent also discloses a method for removing the outer multiple ply sequence from an HDI structure with two multiple ply sequences. The choice of materials suitable to meet the requirements for such a module, however, is extremely limited. Furthermore, fabricating an electrical circuit HDI module of this type with more than two multiple ply sequences is extremely difficult. Thus, fabricating an electrical circuit HDI module that meets a multiplicity of engineering design and materials requirements and includes the desired capability for reconstruction and repair is not always feasible or practical.

A need exists for a reconstructible electrical circuit HDI module made from commonly available materials to improve the capability to produce defect free modules and to expand the scope of engineering and design alternatives for fabricating such a module.

SUMMARY OF THE INVENTION

One object of the invention is to provide a reconstructible electrical circuit HDI module and a method for remaking it in which an engineering design change or repair of a defect may be effected without removal and replacement of the entire electrical interconnection structure.

Another object of the invention is to provide a reconstructible electrical circuit HDI module and method for remaking it in which plies in the electrical interconnection structure are separately removable, such as by dissolution or etching, without damaging or impairing the remaining portion of the module.

Still another object is to provide a reconstructible electrical circuit HDI module and method for remaking it in which more than two multiple ply sequences may be successively stacked over the components and substrate.

An additional object is to provide a reconstructible electrical circuit HDI module fabricated from commonly available polymers, inorganic compounds and metals to provide a wide scope of possibilities for engineering and designing such a module.

Another object of the invention is to provide a reconstructible electrical circuit HDI module and method for remaking it in which a "generic" module portion includes connections to each interconnection pad to permit the design and fabrication of many different electrical circuits, as well as to facilitate testing and repair.

In accordance with the invention, a reconstructible electrical circuit module, such as an integrated circuit module, is provided which incorporates a high density interconnect (HDI) structure. The module includes a substrate, at least one electrical circuit component, and an electrical interconnection structure. The electrical interconnection structure includes at least one multiple ply sequence stacked over the component and substrate. The first ply of the multiple ply sequence comprises an inorganic compound, such as an inorganic oxide protective barrier film, the second ply comprises a dielectric material, such as a polymer film, overlying the first ply, and the third ply comprises metal lands overlying predetermined areas of the second ply providing electrical connections to the component through via holes in the first and second plies. The second and third plies are each separately removable by a process that leaves the underlying module portion substantially unimpaired. Likewise, the first ply, unless adjacent the substrate and component, is removable by a process that leaves the remaining portion of the module substantially unimpaired. Thus, the portion of the module underlying each of the aforesaid plies is substantially unimpairable by a process for removing the corresponding ply.

A method for remaking the aforesaid module entails first removing the metal layer, such as by etching. Next, the dielectric material, such as a polymer film, is removed by dissolving it with a solvent, or alternatively, depending upon the material, by dry etching it, such as with a plasma. After the dielectric material is removed, another dielectric material may be deposited on the now exposed inorganic compound film and a metal layer may be deposited on the polymer or, alternatively, the removal process may be extended to remove, by etching, the exposed inorganic compound film, unless adjacent the substrate and components.

BRIEF DESCRIPTION OF THE DRAWINGS

The subject matter regarded as the invention is particularly pointed out and distinctly claimed in the concluding portion of the specification. The invention, however, together with further objects and advantages thereof, may best be understood by reference to the following detailed description when read with the accompanying drawings in which:

DETAILED DESCRIPTION OF THE INVENTION

Related patent application Ser. No. 07/791,690, filed Nov. 11, 1991, discloses a moisture-proof electrical circuit high density interconnect (HDI) module and a method for making the module. The method disclosed therein is suitable for fabricating a reconstructible electrical circuit HDI module in accordance with the invention, as illustrated in FIG. 1, where the module is made from those substances or materials herein described.

Figure 1:
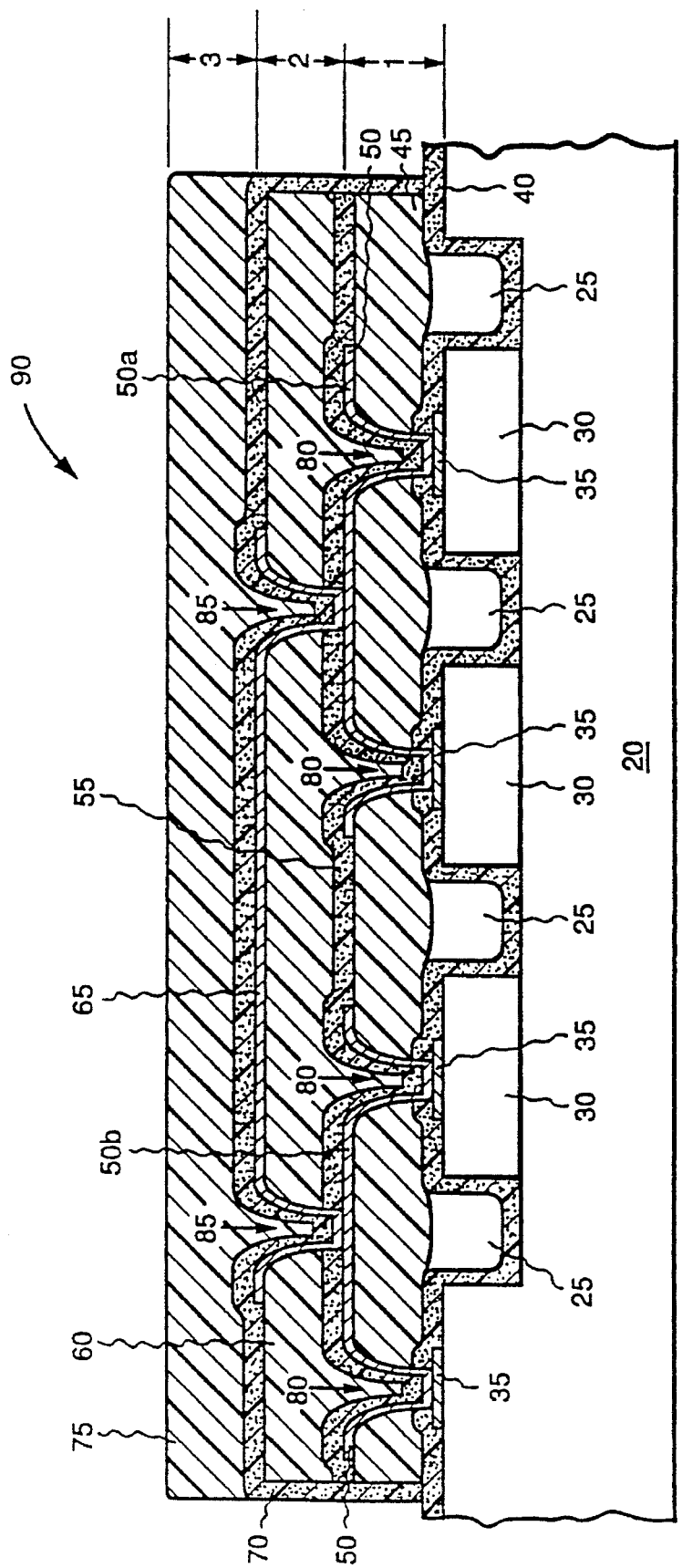
FIG. 1 is a cross-sectional view of a portion of a reconstructible electrical circuit HDI module wherein the electrical interconnection structure includes two multiple ply sequences providing interchip connections.

As shown in FIG. 1, an electrical circuit module 90 includes a substrate 20, a plurality of mutually spaced, electrical circuit components, such as integrated circuit chips 30, and an electrical interconnection structure overlying the components and substrate. The electrical interconnection structure illustrated in FIG. 1 includes two successively stacked multiple ply sequences, respectively designated 1 and 2 at the side or edge of the electrical interconnection structure. An outer coating 3 immediately overlies the electrical interconnection structure.

Chips 30 are situated on substrate 20 in a cavity and bonded to the substrate with a thermoplastic resin adhesive, such as ULTEM® 6000 available from General Electric Co., Pittsfield, Mass., or other adhesives as disclosed in patent application Ser. No. 07/546,964, "High Temperature Polyetherimide Compositions and Method for Making," filed Jul. 2, 1990, assigned to the assignee of the present invention and herein incorporated by reference. The components are positioned in the cavity so that their tops are substantially even with the upper substrate surface and so that gaps 25 separate the components from each other and from the cavity walls. It will be understood, however, that components may be disposed on the upper substrate surface rather than in a cavity or, alternatively, each respective component may be placed in a separate cavity.

Metal interconnection pads 35 are disposed on chips 30 and substrate 20, typically to provide a conductive link to circuitry external to the module as may be required for specific applications. It will be understood that each component typically requires a plurality of interconnection pads and that the substrate may include more than one pad or no pads.

Although FIG. 1 illustrates an electrical interconnection structure with two successively stacked multiple ply sequences, it will be understood that such a structure may include more or fewer multiple ply sequences, as may be required for a specific electrical circuit module. As illustrated, each sequence in this embodiment includes three plies. The first ply comprises an inorganic compound, such as an inorganic oxide film, the second ply comprises a dielectric material, such as a polymer film, immediately overlying the first ply, and the third ply comprises metal lands forming a layer immediately overlying predetermined areas of the second ply. In FIG. 1, multiple ply sequence 1 adjacent the components and substrate includes inorganic oxide film 40, dielectric polymer film 45, and metal layer 50. Multiple ply sequence 1 immediately underlies sequence 2, which is most remote from the substrate and components and which includes inorganic oxide film 55, dielectric polymer film 60, and metal layer 65.

Each sequence further includes a plurality of via holes extending through its film portion. Thus, sequence 1 adjacent the substrate and components includes four via holes 80 shown in FIG. 1. Likewise, as shown, sequence 2 includes two via holes 85.

Outer coating 3 comprises inorganic oxide film 70 underlying dielectric polymer film 75, as illustrated in FIG. 1. Film 70 overlies the top and sides of the electrical interconnection structure. In contrast, polymer film 75 overlies the portion of inorganic oxide film 70 on top of the electrical interconnection structure.

In electrical circuit HDI module 90, the portion of the module immediately underlying a ply in the electrical interconnection structure, such as the second and third plies in each multiple ply sequence, comprise substances or materials substantially unimpairable by a process for removing the corresponding ply. In the context of this invention, this means that the portion of the module remaining after such removal is substantially reusable or operable by depositing one or more additional plies on the remaining module portion to provide a complete and operational electrical circuit module.

Similarly, the remaining portion of the module immediately underlying the first ply, unless immediately adjacent the substrate and components, is substantially unimpairable by a process for removing the first ply. In the case of multiple ply sequence 1, the substrate and components constitute the remaining portion of the module. In the case of multiply ply sequences other than the sequence immediately adjacent the substrate and component, the remaining portion of the module includes the second and third plies of the immediately underlying multiple ply sequence.

In the embodiment shown in FIG. 1, for the first or lower multiple ply sequence 1, film 40 comprises silicon dioxide. Another inorganic oxide suitable for film 40 includes titanium dioxide. Film 40, as disclosed in patent application Ser. No. 07/791,690, may be deposited using a chemical vapor deposition atomic layer epitaxy (CVD ALE) process or other vacuum deposition processes and typically has a thickness of approximately several microns. It will be understood that film 40 should be substantially pinhole free and of sufficient thickness to provide protection to the underlying components. This may prove crucial during later processing of the module, such as where substances dissolve or etch plies overlying film 40. Thus, film 40 should typically be in the range of approximately 1 to 10 microns.

The aforesaid patent application Ser. No. 07/791,690 also describes the formation of via holes, such as via holes 80, in the inorganic oxide film. As illustrated in FIG. 1, this film conforms to the top and sides of the components, to the bottom and sides of the cavity in substrate 20, and to the upper substrate surface and thus leaves gaps 25 between film 40 and polymer film 45. In an alternative embodiment of the invention, gaps 25 may be substantially filled, typically with a dielectric polymer material.

In a process for remaking the electrical circuit module, inorganic oxide film 40 typically will not be removed from the substrate and components. In general, removal of film 40 will typically occur only when replacing an underlying component. Thus, instead of directly removing film 40, the component to be replaced may be physically removed or lifted from substrate 20 in a process that would necessarily disrupt film 40 by removing the portion of the film in direct contact with the component. One example of such a process is disclosed in U.S. Pat. No. 4,878,991, "Simplified Method for Repair of High Density Interconnect Circuits," by Eichelberger et al., which is assigned to the assignee of the present invention and herein incorporated by reference. After replacing the component, another inorganic oxide film may be deposited and via holes formed by the method disclosed in patent application Ser. No. 07/791,690. Furthermore, in a process for remaking the electrical circuit module to repair a fault in the electrical connections or to redesign the circuit, film 40 would typically not be removed. If a different pattern of via holes is required in either of these instances, an inorganic oxide film may be deposited immediately overlying film 40 and via holes may then be formed.

Figure 2:
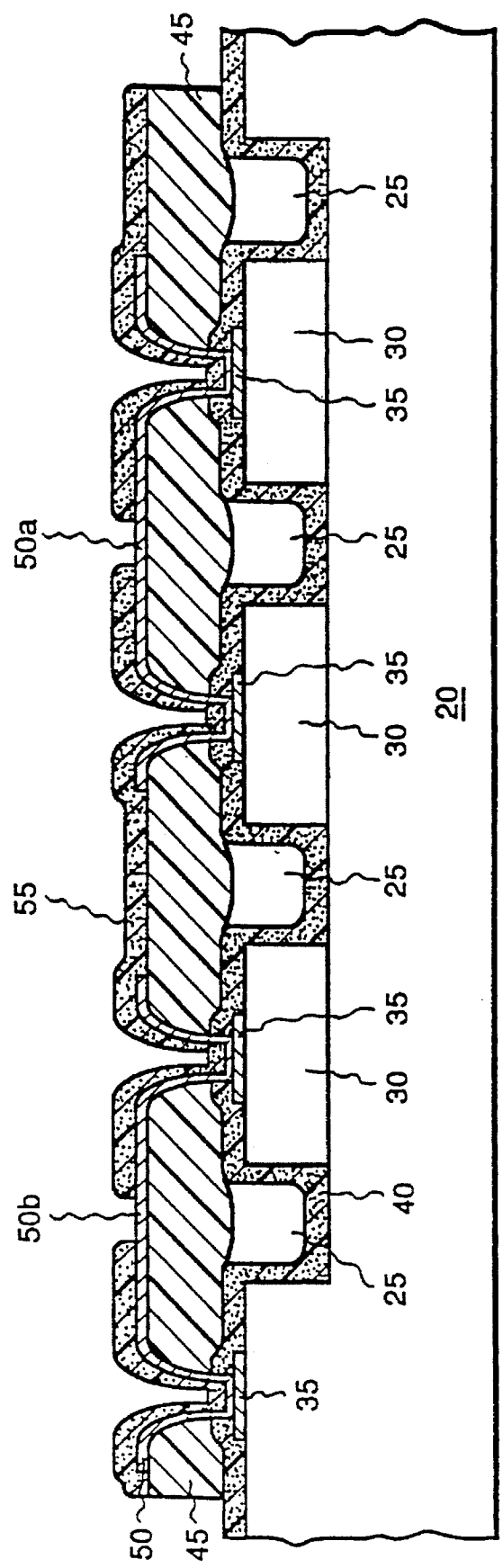
FIGS. 2 to 5 are cross-sectional views providing a partial, schematic representation of different stages in a method for remaking an electrical circuit HDI module in accordance with the invention.

In a process for remaking the electrical circuit module, the inorganic oxide film in upper multiple ply sequences, such as film 55 in FIG. 1, is removable without substantially impairing the remaining portion of the module underlying the film. In such a process, the portion of the module with film 55 exposed, illustrated in FIG. 2, is immersed in an etchant until the film is removed.

A number of substances are suitable for removing film 55 without substantially impairing the underlying multiple ply sequences, particularly metal layer 50 and polymer film 45. Thus, metal layer 50 and polymer film 45 provide a barrier of protection for inorganic oxide film 40 and the underlying components. For example, a solution of ammonium bifluoride with a concentration in the range of approximately 0.5 to 5% by weight will etch the inorganic oxide film. Required immersion time varies with film thickness and solution temperature. For an inorganic oxide film of thickness in the range of approximately 1 to 5 microns, removal of the film by this technique should require approximately 1 to 2 minutes at room temperature, i.e., approximately 25° C. At higher temperatures less time is required.

In the embodiment illustrated in FIG. 1, dielectric polymer film 45 may comprise a KAPTON polyimide film having high thermal stability, available from E. I. dupont de Nemours & Co., Wilmington, Del., typically 25 microns in thickness, coated on one side with ULTEM 1000 thermoplastic resin. This coating facilitates lamination of polymer film 45 to immediately underlying inorganic oxide film 40. Further details regarding this process are disclosed in patent application Ser. No. 07/791,690 and in U.S. Pat. No. 4,933,042, "Method for Packaging Integrated Circuit Chips Employing a Polymer Film Overlay Layer," issued Jun. 12, 1990, assigned to the assignee of the present invention and herein incorporated by reference. Via holes are formed in film 45 in accordance with the method described in the aforesaid patent application.

Figure 3:
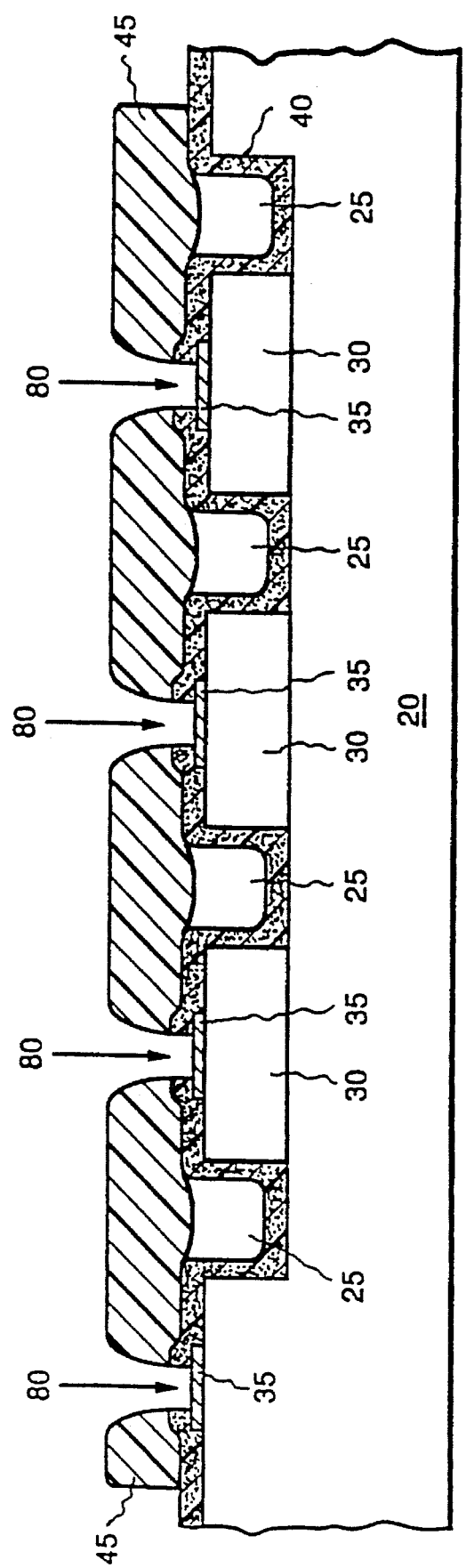

Several possibilities exist for removing polymer film 45 while leaving inorganic oxide film 40 and the exposed or bottom metal surfaces provided by pads 35 underlying via holes 80 substantially unimpaired. In one method, the portion of the module remaining with polymer film 45 exposed, as illustrated in FIG. 3, is heated to a temperature sufficient to lower the melt viscosity of the ULTEM 1000 thermoplastic resin coating, approximately 300° C., and the KAPTON polyimide film is physically lifted or peeled from the module. Alternatively, several suitable solvents are available to dissolve the ULTEM 1000 thermoplastic resin coating without attacking film 40 or the exposed metal surfaces, such as N-methyl pyrrolidone, chloroform, acetophenone, or anisole. The portion of the module shown in FIG. 3 is sprayed with, or immersed in, the solution at a temperature in the range of approximately 25° C. to 100° C. for an immersion time in the range of approximately 1 or 2 to 30 minutes. After dissolving the ULTEM 1000 thermoplastic resin coating, the KAPTON polyimide film is removed as previously described. It will be understood that inorganic oxide film 40 provides crucial protection to the underlying components from these and other solvents and therefore it must be sufficiently thick and substantially pinhole free.

In the embodiment illustrated in FIG. 1, metal layer 50 is comprised of metal lands or segments 50a and 50b immediately overlying predetermined areas of polymer film 45. In one embodiment, a three metal sublayer titanium-copper-titanium combination, with the sublayers overlying one another in succession, constitutes the metal layer. Such a metal layer may be formed as provided in patent application Ser. No. 07/791,690.

As illustrated in the embodiment of FIG. 1, each multiple ply sequence has a plurality of via holes extending through its film portion exposing bottom metal surfaces immediately underlying the sequence. In the multiple ply sequence adjacent to the components and substrate, the exposed or bottom metal surfaces are provided by metal interconnection pads 35. Thus, as illustrated, metal layer 50 segments 50a and 50b line the interior surface of via holes 80 and come into contact with underlying metal interconnection pads through these via holes, thereby providing electrical connections between selected bottom or exposed metal surfaces.

Figure 4:
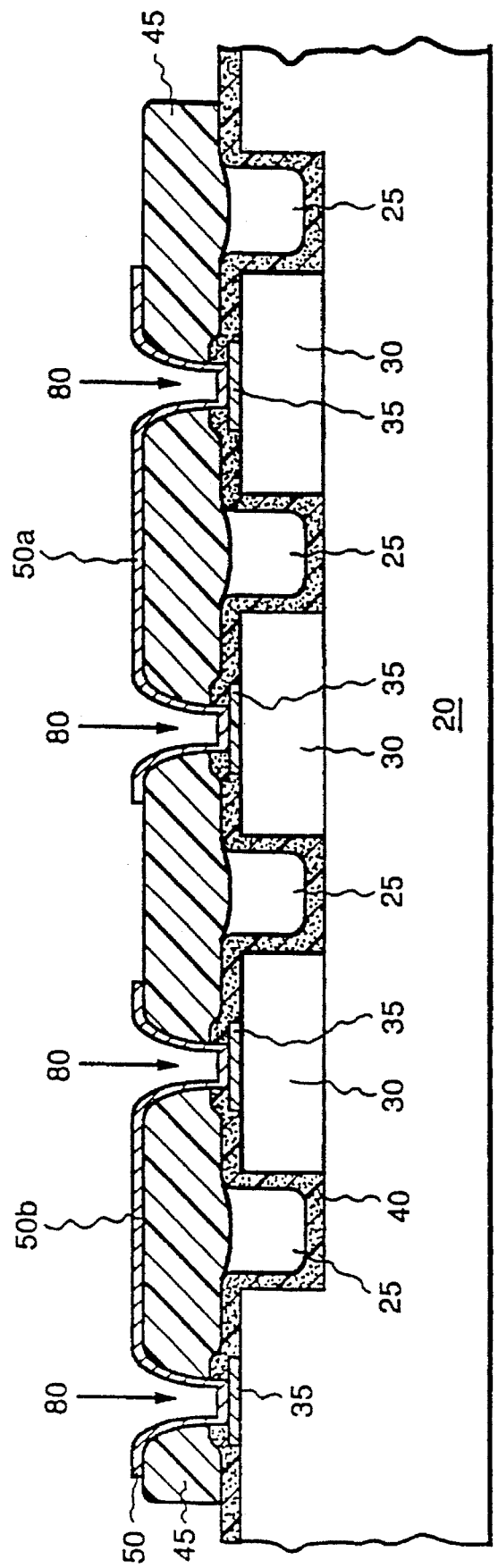

In a method for remaking the module in accordance with the invention, metal layer 50 may be removed by etching with one or more substances. For example, where the metal layer comprises a titanium-copper-titanium combination, the exposed, upper titanium layer may be removed by immersion of the module portion shown in FIG. 4 in a dilute solution of ammonium bifluoride, the solution described above for removing the silicon dioxide film. Thus, for example, when an inorganic oxide film of the immediately overlying sequence, such as film 55 in FIG. 1, is being removed, the upper titanium sublayer of the immediately underlying metal layer may also be removed. It will be understood, however, that the underlying metal layer is substantially unimpaired in the context of this invention because ammonium bifluoride does not attack either the copper sublayer immediately underlying the upper titanium sublayer or polymer film 45. The copper sublayer is then etched with a substance that leaves the lower titanium sublayer and polymer film 45 substantially unimpaired, such as dilute nitric acid with approximately a 5 to 25% concentration by weight, or ferric chloride with a similar concentration, for approximately 1 or 2 to 30 minutes at a temperature in the range of approximately 25° C. to 50° C. Finally, the lower or bottom titanium sublayer may be removed by immersion of the module portion in an ammonium bifluoride solution as previously described above, or in a dilute hydrogen fluoride solution of a similar concentration, at approximately room temperature for less than a minute. Neither solution will attack underlying polymer film 45.

In the process described immediately above, the copper sublayer acts as a barrier of protection for the portion of the module immediately underlying via holes 80, including pads 35. Thus, for example, when removing the lower titanium sublayer in multiple ply sequences other than the sequence immediately adjacent the substrate and components, the copper sublayer of the metal layer of the immediately underlying sequence provides a barrier of protection. In the process for removing the lower titanium sublayer of the sequence immediately adjacent the substrate and components, such as in metal layer 50, however, the solution of ammonium bifluoride or hydrogen fluoride may attack metal interconnection pads 35, which are typically made of aluminum or gold. Nonetheless, the pads are left substantially unimpaired due to the short immersion time and relative thickness of the pads.

In the embodiment illustrated in FIG. 1, multiple ply sequence 2 most remote from the components and substrates, like the immediately underlying sequence 1, includes three plies overlying one another in succession. In this embodiment, the first ply, film 55, comprises silicon dioxide, like film 40. The second ply, film 60, which immediately overlies film 55, comprises a dielectric polymer that may be different from the material comprising film 45, and the third ply, metal layer 65, comprises three metal sublayers, as described above, immediately overlying predetermined areas of film 60. Like the immediately underlying sequence, the second or upper multiple ply sequence includes via holes extending through the film portion of the sequence exposing underlying bottom metal surfaces. For multiple ply sequences other than the sequence immediately adjacent the substrate and components, the exposed or bottom metal surfaces are provided by the metal layer of the immediately underlying multiple ply sequence. Multiple ply sequences other than the sequence immediately adjacent the substrate and components, such as sequence 2 in FIG. 1, are formed as previously described for the sequence immediately adjacent the substrate and components or as described in patent application Ser. No. 07/791,690.

Multiple ply sequences other than the sequence immediately adjacent the substrate and components may have a similar structure and include the same or similar substances or materials; however, important differences may also be present. For example, as illustrated in FIG. 1, spaces or gaps may exist in selected locations between the inorganic oxide and dielectric polymer films of the sequence immediately adjacent the substrate and component. These gaps or spaces are not present in sequences other than the sequence immediately adjacent the substrate and components, such as sequence 2 in FIG. 1. Furthermore, although other multiple ply sequences may have the same composition as the sequence immediately adjacent the substrate and components, typically the composition of other sequences will be different. Thus, it will be understood that the polymer film of the remaining multiple ply sequences, such as film 60, may in a fashion similar to film 45 comprise a KAPTON film with a thermoplastic adhesive coating. In this embodiment, film 55 comprises silicon dioxide and metal layer 65 comprises a titanium-copper-titanium combination, similar to film 40 and layer 50 in sequence 1, respectively; however, polymer film 60, in contrast with film 45, comprises a siloxane-polyimide polymer available from MicroSi Inc., and sold under the name SPI-129. Film 60 may be applied by spraying or spin coating a polymeric solution and subsequently baking the coated solution to remove solvents, as disclosed in patent application Ser. No. 07/791,690. Film 60 may alternatively be applied by extrusion, as is well-known in the art.

After the second or upper multiple ply sequence illustrated in FIG. 1 has been deposited, the module portion fabricated thus far may be tested to ascertain defects, if any, and confirm functionality or operability of the electrical circuit. If testing reveals no defects and demonstrates satisfactory functionality and operability, outer coating 3 may be deposited, again by a method disclosed in patent application Ser. No. 07/791,690. Although film 70 comprises silicon dioxide and film 75 comprises SPI-129 polymer, other polymers, including thermoplastics and thermosets, would alternatively constitute suitable films for an outer coating. If necessary, outer coating 3 may be removed leaving the immediately underlying electrical interconnection structure substantially unimpaired, largely in accordance with the method described previously for removing film 55 and described hereinafter for removing film 60. However, it will be understood that some aspects of the method may vary depending upon the particular material constituting the outer coating.

Instead of depositing outer coating 3, the upper or most remote multiple ply sequence may alternatively be removed while leaving the portion of the module remaining substantially unimpaired, for purposes such as to modify or repair the pattern of electrical connections. It will be appreciated that metal layer 65 may be removed substantially in the manner described previously regarding the first multiple ply sequence.

Figure 5:
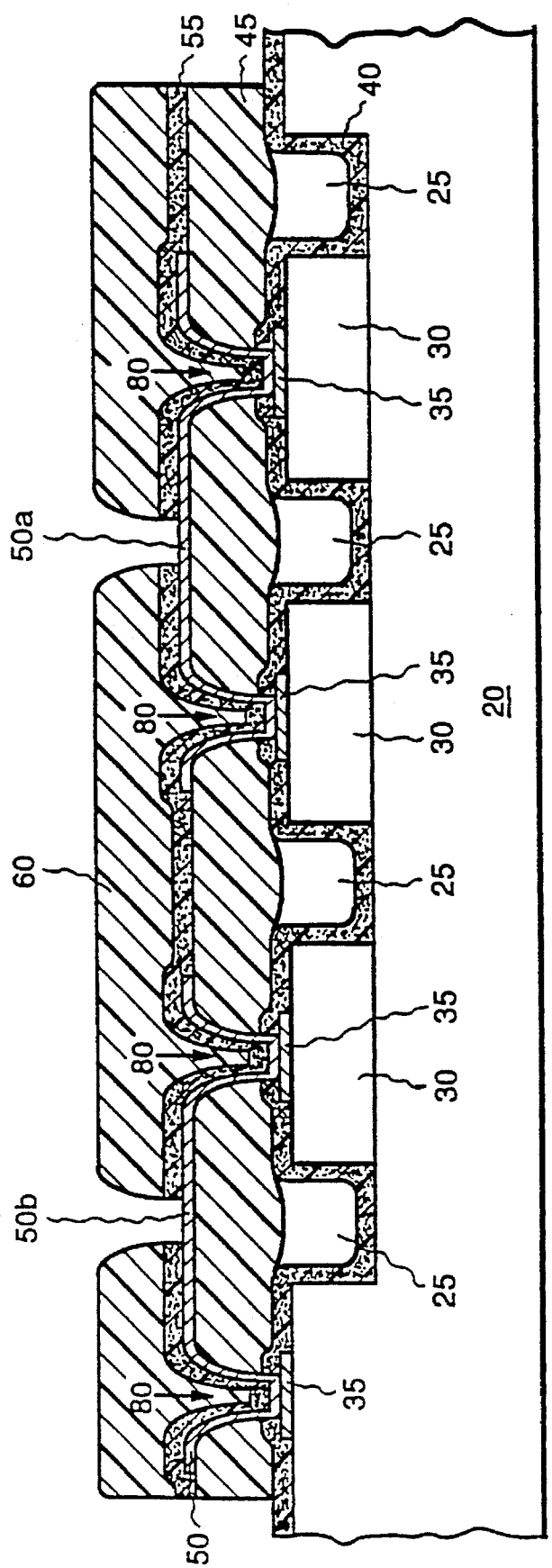

After removing metal layer 65, polymer film 60 may be removed while leaving the remaining portion of the module substantially unimpaired. The removal of film 60 may be accomplished with one or more solvents that dissolve the polymer film, but do not attack the immediately underlying inorganic oxide or exposed or bottom metal surfaces. For example, diglyme/toluene will dissolve SPI-129 polymer. Other solvents suitable for removing SPI-129 polymer include N-methyl pyrrolidone, anisole, and acetophenone. In particular, after the removal of metal layer 65, the remaining portion of the module, illustrated in FIG. 5, is immersed in solvent, as previously described for the removal of polymer film 45. Removing the polymer film, which is approximately 5 to 50 microns in thickness, where the temperature of the solvent is in the range of approximately 25° C. to 80° C., will typically require in the range of approximately 1 to 40 minutes. A greater film thickness or lower solvent 43 temperature will increase the immersion time necessary to remove the film. After the polymer film is substantially removed by immersion, the module portion may be sprayed or rinsed with a solvent to remove any polymer residue and subsequently sprayed or rinsed with water, such as in a high pressure scrub. Finally, the remaining module portion may be baked to remove moisture.

After film 60 has been removed, another polymer film, and a metal layer overlying it, may be deposited, substantially in accordance with the method disclosed in patent application Ser. No. 07/791,690. Where modification of the pattern of electrical connections is required, as in the case of an engineering modification, typically another inorganic oxide film will be deposited over inorganic oxide film 55 and via holes formed, as required, extending through both inorganic oxide films. However, before the deposition of this inorganic oxide film, film 55 may be removed substantially in accordance with the method previously described, leaving the remaining portion of the module, including metal layer 50 and polymer film 45, substantially unimpaired. Alternatively, if repair or modification is required in the first multiple ply sequence, that sequence may be removed as previously described, leaving the remaining portion of the module i.e., the components and substrate, substantially unimpaired. As suggested, however, inorganic oxide film 40 of sequence 1 will typically not require removal to permit refabrication of the electrical interconnection structure.

Based upon the previous description, it will be understood that the inorganic oxide film comprising the first ply of each multiple ply sequence in the electrical interconnection structure of the embodiment illustrated in FIG. 1 acts as a barrier against damage to the metal layer interconnect, polymer, and electrical circuit components underlying that inorganic oxide film, especially during the removal of plies overlying the film. The property of being substantially pinhole free and sufficiently thick in part allows the inorganic oxide films to provide this protection. This further permits substantial variety in the materials from which the module may be fabricated while providing the capability to reconstruct or repair the module a single ply at a time. For example, an inorganic oxide film interspersed between the polymer films in an electrical interconnection structure, as previously described, permits fabrication of an electrical circuit HDI module with the same polymer in each sequence, or with several polymers that dissolve in the same solvent. Without inorganic oxide films to provide a barrier during either fabrication or refabrication, solvents used to either apply or remove a polymer film of an upper sequence may impair or damage the polymer film of an underlying or lower sequence.

A second embodiment of the invention is also illustrated in FIG. 1 and is similar to the previous embodiment except that in this second embodiment, dielectric polymer film 60 comprises a soluble preimidized polyimide, such as XU-218 available from Ceiba-Geigy Corporation. This material dissolves in relatively low boiling point solvents, such as cyclohexanone. Other relatively low boiling point solvents for XU-218 include tetrahyrofuran, dioxane, and dimethylformamide with boiling points in the range of approximately 60° C. to 160° C. These solvents are useful in the fabrication of an electrical circuit module because a polymeric solution may be sprayed or spun onto a portion of the module and subsequently baked to remove the solvent at a temperature that does not damage the module portion. Other polyimides, such as polyetherimides and siloxane polyimides, would also make suitable dielectric polymer films.

In this second embodiment, each ply other than the ply immediately adjacent the substrate and components may be removed leaving the remaining module portion substantially unimpaired, although film 60 in this second embodiment is removable by a different process than previously described. After removal of outer coating 3 and metal layer 65, film 60 is removed by a dry etching process instead of the wet etching process described previously for the first embodiment.

To remove XU-218 polymer film 60, the portion of the module remaining after removal of metal layer 65, illustrated in FIG. 5, is placed in an apparatus for plasma etching. For example, an oxygen gas may be excited in a suitable glow discharge reactor to generate excited species with sufficient energy to break polymer bonds and thus volatilize or evaporate the polymer film. Likewise, unidirectional dry polymer etching may be achieved by reactive ion etching. Etching the XU-218 film with oxygen in this manner occurs at a rate of approximately 4000 Å per minute. In contrast, the etch rate for silicon dioxide film 55, immediately underlying polymer film 60, is approximately 20 Å per minute. Thus, due to the relatively slow rate of etching for film 55, film 60 may be completely removed leaving underlying film 55 and the remaining portion of the module substantially unimpaired. It will be appreciated by those skilled in the art that the oxygen does not attack the exposed bottom metal surfaces provided by the metal layer of the immediately underlying sequence. In the alternative, other substances may similarly etch XU-218, such as argon or carbon tetrafluoride.

As described, polymer film 60 may be removed by non-solvent techniques in a manner that leaves the immediately underlying inorganic oxide film or metal layer substantially unimpaired, meaning that the underlying ply or portion of the module remaining after removal is substantially reusable or operable by depositing one or more additional plies on the remaining module portion to provide a complete and operational electrical circuit module. This is possible primarily because the molecular bonds of polymers can be selectively broken by plasmas that will not substantially attack inorganic oxides or metals. Nonetheless, during the process of fabricating the module, it would be desirable to include an inorganic oxide film of more than sufficient thickness to permit some etching without being substantially affected, such as approximately in the range of two to ten microns. This provides a few microns of tolerance for that inorganic oxide film. Because the rate of etching will vary with the particular materials used to fabricate the module and with the particular etchant, the removal process may require adjustment to properly account for the particular etching rate. In addition, depending on the etchant, the polymer and the inorganic oxide, a possibility exists that no inorganic oxide will be removed by the etchant for removing the immediately overlying polymer film.

Inorganic oxide film 55 and the first multiple ply sequence, which includes patterned metal layer 50, dielectric polymer film 45, and protective inorganic oxide film 40, remain intact over the components and substrate after removal of film 60. The module may be reprocessed, reconfigured, or otherwise changed as previously described regarding the first embodiment. Alternatively, inorganic oxide film 55 and then metal layer 50 and polymer film 45 may be removed, again as previously described, while leaving the remaining portion of the module substantially unimpaired.

The dielectric polymer film in any multiple ply sequence, including the sequence immediately adjacent the substrate and components, may comprise either a thermoplastic or a thermoset polymer. A thermoplastic comprises a polymeric material which after successive cycles of heating and cooling substantially retains its initial melting point. That is, no substantial cross-linking of the material takes place during the heating, melting and resolidification process. When cooled below this melting point, the thermoplastic "resolidifies" and remains adherent to objects with which it is in direct contact. In contrast, a thermoset polymer comprises a polymeric material in which cross-linking takes place the first time it is heated or during its preparation process, such that the material either no longer melts or melts at a much higher temperature than it did prior to its initial heating or its formation, as the case may be.

A thermoplastic polymer may usually, although not always, be removed by dissolving it in an appropriate solvent, as previously described for SPI129. Likewise, a thermoset polymer, such as a blend of SPI-129 and epoxy as disclosed in patent application Ser. No. 07/454,545, entitled "An Epoxy/Polyimide Copolymer Blend Dielectric and Layered Circuits Incorporating It," which is assigned to the assignee of the present invention and herein incorporated by reference, may be removed by dry etching. It will be understood, however, that thermoplastics may also be removed by dry etching, as described above for XU-218.

In the embodiments of the invention as herein disclosed, various materials are suitable to provide either the inorganic oxide film, polymer dielectric film, or patterned metal interconnect layer. For example, suitable inorganic oxides include aluminum oxide, titanium dioxide, silicon dioxide, or chromium oxide. These materials may be applied using appropriate CVD techniques and may be removed by etching plasmas, such as combinations of oxygen and carbon tetrafluoride. Likewise, wet chemical etching may employ appropriate acid or base solutions, such as described in *Thin Film Processes*, edited by John L. Vassen and Werner Kern, (1978), available through Academic Press. Suitable dielectric polymers include: polyimides, polyquinoline, siloxane-polyimide, polysulfone, benzocyclobutene, polyquinoxaline, or commercially available polyimides from DuPont Chemical including PI-2540, PI-2555, KAPTON, Ciba-Geigy XU-218, and polyimides available from Hitachi, National Starch and Chemical, Allied Signal Corporation, or Micro Si Corporation. These polymers may be applied by either spinning or spray coating or in some instances by lamination with appropriate adhesives, such as siloxane-polyimide or ULTEM 1000 thermoplastic resin. For lamination, the selected polymer must be first coated as a freestanding film and have thermal stability at the adhesive lamination temperature. Suitable substances for plasma etching various polymers are described in *Plasma Etching, an Introduction*, edited by Dennis M. Manos and Daniel L. Flamm, (1989), available through Academic Press. Suitable metals include copper, gold, aluminum and nickel. In some instances these metals may be used with a barrier metal such as titanium or chromium, as previously described with respect to copper, and as disclosed in U.S. patent application Ser. No. 07/791,690. Suitable substances for dry etching metals are described in "Methods of Metal Patterning and Etching, " by B Gorowitz, R. J. Saia, and E. W. Balch, chapter 4, volume 15 of *VLSI Electronics: Microstructure Science*, edited by N. G. Einspruch, S. S. Cohen and G. Gildenblat, (1987), available through Academic Press.

The above list of inorganic oxide substances, polymers and metals is provided for illustrative purposes and is not intended to limit the scope of the invention. The choice of materials for use in a reworkable or reconstructible module is determined by the overall process compatibility between these substances. Systematic development of selected etchants for the inorganic film and solvents for the dielectric polymer film by persons skilled in the art will result in the selection of suitable combinations of substances for this reworkable or reconstructible module.

Figure 6:
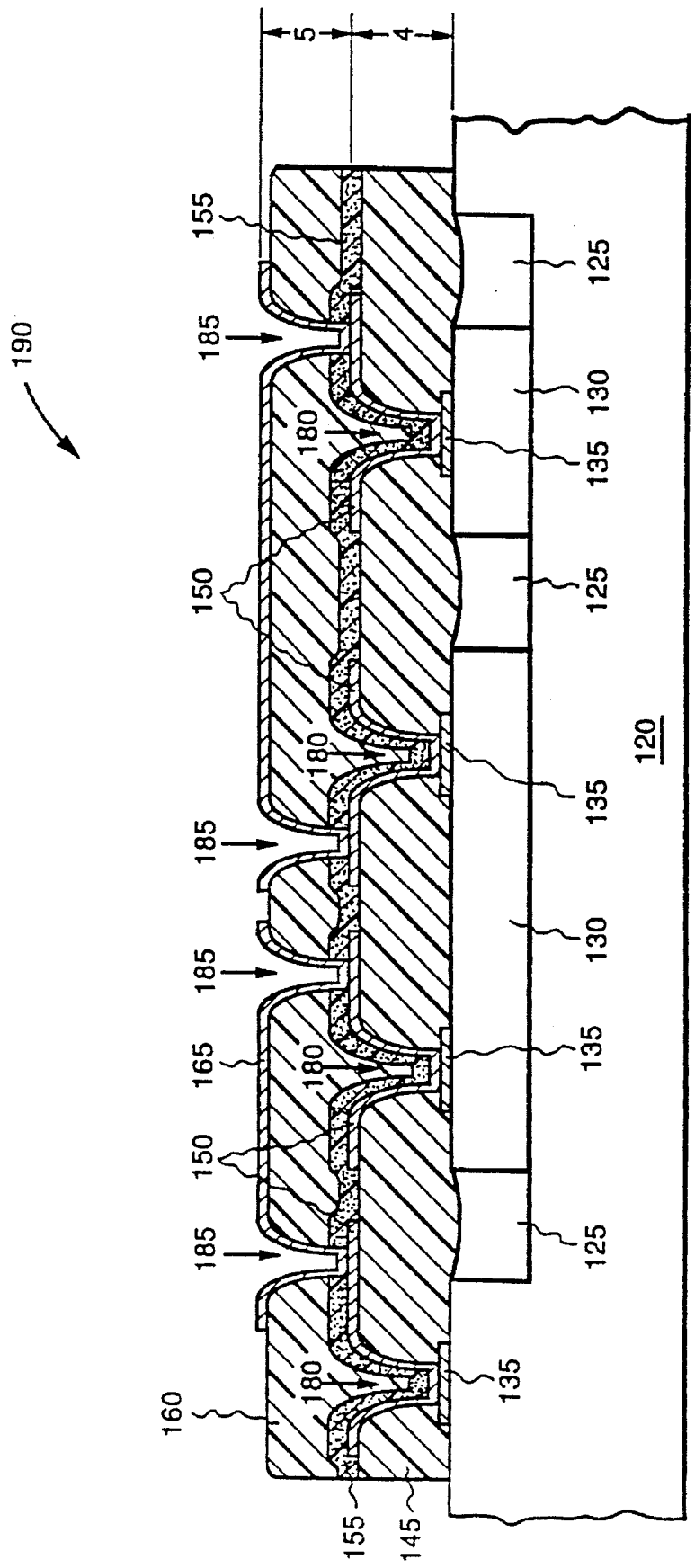
FIGS. 6 and 7 illustrate alternative embodiments in accordance with the invention.

In a third embodiment of the invention, as illustrated in FIG. 6, a generic electrical interconnection structure below inorganic oxide film 155 permits many electrical circuits to be fabricated from the same module portion by depositing one or more removable multiple ply sequences over the inorganic oxide film and providing intercomponent and intracomponent electrical connections. A plurality of mutually spaced, electrical circuit components 130 are disposed on substrate 120 with the substrate and components further including a plurality of metal interconnection pads 135. The electrical interconnection structure of module 190, shown in FIG. 6, includes only one inorganic oxide film 155. It will be understood, however, that an electrical interconnection structure may include more than one inorganic oxide film and fewer than an inorganic oxide film in every multiple ply sequence. The number and placement of the inorganic oxide films will depend upon the specific module and its application.

As illustrated, the sequence most remote from the substrate and components, designated on the side or edge of the electrical interconnection structure as sequence 5, includes inorganic oxide film 155. As described for each of the multiple ply sequences in the first embodiment illustrated in FIG. 1, sequence 5 further includes dielectric polymer film 160, metal layer 165 comprising metal lands immediately overlying predetermined areas of film 160, and via holes 185. For sequence 5, as for multiple ply sequences of the first embodiment other than the sequence immediately adjacent the substrate and components, metal surfaces are provided by the metal layer of the immediately underlying sequence.

Although FIG. 6 illustrates the most remote multiple ply sequence as including the inorganic oxide film, it will be understood that where the electrical interconnection structure includes more multiple ply sequences than depicted in FIG. 6, the sequence including the inorganic oxide film may be in a multiple ply sequence less remote from the substrate. Typically, however, for an electrical circuit HDI module in accordance with the invention as illustrated in FIG. 6 and described herein, the sequence including the inorganic oxide film will be either the most remote multiple ply sequence or the sequence immediately underlying the most remote multiple ply sequence.

The remaining multiple ply sequences other than the most remote sequence in the electrical interconnection structure, such as sequence 4 designated on the side of FIG. 6, include a first ply comprising dielectric polymer film 145, a plurality of via holes 180 extending through the polymer film, and a second ply comprising layer 150 which includes metal lands overlying predetermined areas of the polymer film. As illustrated in FIG. 6, via holes 180 extend to bottom metal surfaces provided by metal interconnection pads 135. Metal lands of layer 150 line the interior surface of each of the via holes, as described for other multiple ply sequences.

In the embodiment illustrated in FIG. 6, each multiple ply sequence in the electrical interconnection structure under inorganic oxide film 155 includes conductive links. Conductive links between the metal layer of the corresponding multiple ply sequence and the metal layer of the immediately underlying multiple ply sequence are provided by the metal lands of the particular multiple ply sequence. However, in the embodiment shown in FIG. 6 only one multiple ply sequence underlies inorganic oxide film 155, thus providing conductive links to the underlying metal interconnection pads 135. Conductive links in each multiple ply sequence under inorganic oxide film 155 are selected so that the metal lands immediately underlying inorganic oxide film 155 are each electrically connected to only one interconnection pad situated on the components and substrate. This embodiment thus provides a generic electrical interconnection structure or module portion below the inorganic oxide film. During fabrication of such a generic electrical circuit HDI module portion, before application of the inorganic oxide film, the electrical connections to each interconnection pad may be tested. Although FIG. 6 illustrates only one multiple ply sequence below inorganic oxide film 155 providing conductive links to each pad, a plurality of sequences may provide these connections.

A generic electrical interconnection structure as previously described enhances the capability to perform testing during fabrication. In such a module, testing of the generic interconnection structure may be performed unencumbered by the particular chips. Likewise, the chips or components may be tested unencumbered by the electrical interconnection structure. Such unencumbered testing is typically not possible due to the connection of different chips or components in a complete or nearly complete electrical circuit.

Once the desired connections are tested successfully, several alternatives for further processing are available. Following one approach, after depositing an inorganic oxide film, such as film 155 in FIG. 6, an electrical circuit may be fabricated by depositing one or more multiple ply sequences to provide connections between selected metal interconnection pads. The electrical connections provided are then tested. If testing demonstrates a defect or unsatisfactory circuit performance, the multiple ply sequences overlying the inorganic oxide film, such as sequence 5 in FIG. 6, may be removed in accordance with the method previously disclosed and one or more multiple ply sequences providing electrical connections may be redeposited.

Likewise, testing may reveal that an electrical interconnection structure is substantially free of defects and electrical circuit components 130 are similarly operable or functional; however, the module may fail to perform the desired functions or fail to operate in the manner anticipated due to a design error. In this instance, the multiple ply sequences above inorganic oxide film 155 may be removed as previously described, while leaving the remaining portion of the module substantially unimpaired. The redesigned one or more multiple ply sequences would be applied to the module portion above inorganic oxide film 155 and replace sequence 5. This would permit the electrical circuit components and the generic electrical interconnection structure below the inorganic oxide film to remain operable or usable and save one-half to three-quarters of the costs associated with remaking the module.

As a second alternative, prior to applying one or more multiple ply sequences providing electrical connections for an electrical circuit, after application of the inorganic oxide film, a multiple ply sequence may be deposited to provide a resistor network including electrical connections to power and ground. More specifically, in a multiple ply sequence overlying inorganic oxide film 155, a substance with poor conductivity may be deposited in place of lands for interconnecting selected exposed or bottom metal surfaces. This substance functions as a resistor. Likewise, coupling selected interconnection pads to either power or ground through this network provides an effective bias or termination. Thus, this resistor network may be designed to "burn-in" the electrical circuit components disposed on substrate 120. Once burn-in has occurred, the multiple ply sequence constituting the resistor network may be removed and one or more multiple ply sequences providing connections for the desired electrical circuit may be deposited, as previously described.

Figure 7:
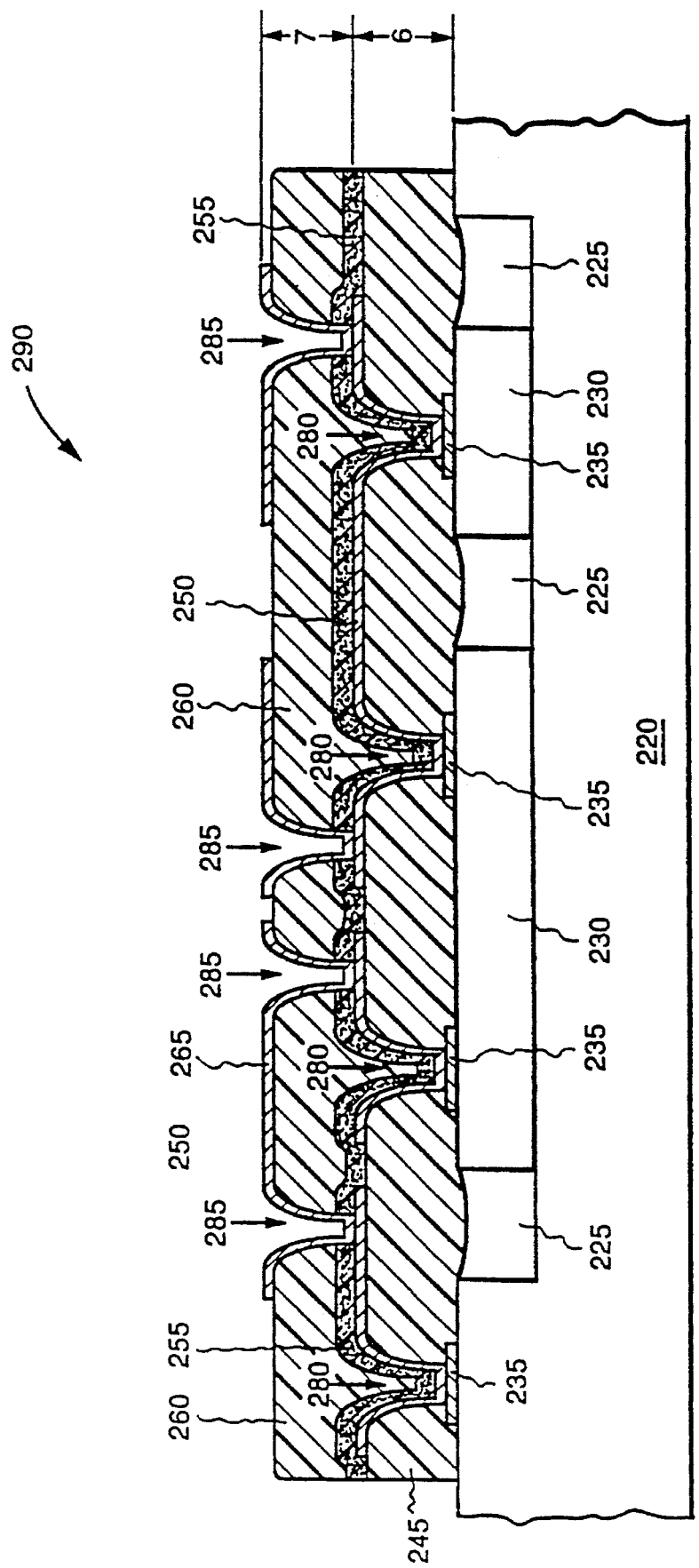

An alternative electrical interconnection structure to the "generic" electrical interconnection structure previously described may be fabricated in which the multiple ply sequences underlying the inorganic oxide film, such as sequence 6 in FIG. 7, provide electrical connections between metal interconnection pads on the same component or between different components and form simple electrical circuits, such as flip-flops, nand-gates, nor-gates, or registers. These simple electrical circuits may be further interconnected by multiple ply sequences overlying the inorganic oxide film to provide more complex electrical circuits. Thus, sequence 6 in FIG. 7 illustrates two metal interconnection pads on different chips connected by a metal land of metal layer 250 immediately underlying inorganic oxide film 255.

During fabrication of an electrical circuit module of the type illustrated in FIG. 7, electrical connections provided to form simple electric circuits, as described above, may be tested, such as previously described. An inorganic oxide film, such as film 255 in FIG. 7 may then be deposited and via holes formed. This provides an alternative "generic" module portion in which many electrical circuits may be fabricated and refabricated. As described above, one or more multiple ply sequences may be deposited over inorganic oxide film 255 of the electrical interconnection structure in order to facilitate further testing, burn-in or design and redesign of electrical circuits.

It will be understood that a "generic" electrical interconnection structures may be fabricated as previously described in which the multiple ply sequences underlying the inorganic oxide film, such as film 155 in FIG. 6, provide not only conductive links from only one interconnection pad to a metal land of the metal layer immediately underlying inorganic oxide film 155, but in addition, provide electrical connections to power and ground for each of the mutually spaced, electrical circuit components 130. Such coupling to power and ground may be provided in the multiple ply sequence immediately underlying the inorganic oxide film. Alternatively, electrical coupling to power and ground for each electrical circuit component may be provided primarily in one or more multiple ply sequences including little or no other electrical connections between selected interconnection pads. If these one or more sequences are provided immediately adjacent the substrate and components, the result will be superior bias delivery to electrical circuit components and reduced electrical signal disturbances for the electrical interconnections in the remaining multiple ply sequences. Furthermore, the likelihood of a defect occurring in a predominantly power or ground multiple ply sequence is much lower than that of a multiple ply sequence with a plurality of electrical interconnections between selected interconnection pads. Thus, more defects will most likely occur in the upper sequences. This embodiment isolates the repair of those defects from the portion of the electrical interconnection structure below the inorganic oxide film 155 in the embodiment of FIG. 6. It will be understood, however, that these multiple ply sequences also couple each interconnection pad 135 through selected conductive links to the metal lands immediately underlying inorganic oxide film 155.

While only certain features of the invention have been illustrated and described herein, many modifications, substitutions, changes and equivalents will now occur to those skilled in the art. For example, for any embodiment of the invention, depending upon the specific application, connections to power and ground for the particular electrical circuit to be fabricated may be provided by multiple ply sequences underlying the inorganic oxide film or, alternatively, by multiple ply sequences overlying the inorganic oxide film. Likewise, inorganic oxide films in a module may be removed by a dry etching process, instead of the wet etching process described herein. Finally, other inorganic compounds other than inorganic oxides, such as inorganic nitrides, may make suitable barrier films. Nonetheless, the fabrication of an electrical circuit HDI module including such a film will depend on the appropriate choice of other thermally stable materials, such as polymers and metals. It is, therefore, to be understood that the appended claims are intended to cover all such modifications and changes as fall within the true spirit of the invention.

What is claimed is:

1. A reconstructible electrical circuit module comprising;

a substrate;

at least one electrical circuit component fabricated on said substrate; and an electrical interconnection structure having a plurality of multiple-ply sequences stacked over said component and substrate, each of said multiple-ply sequences including an inorganic oxide film as a first ply, a dielectric polymer film as a second ply overlying said first ply, and metal lands as a third ply overlying predetermined areas of said second ply;

wherein a portion of said module underlying each first ply of each different one of said plurality of sequences is substantially unimpairable by a first-ply-removing process for removing each particular first ply, to provide easy reconstructability;

for a first ply in a first multiple-ply sequence of said plurality of multiple-ply sequences, which is closest to said substrate, said portion includes said at least one component and said substrate; and for a first ply in any remaining multiple-ply sequences of said plurality of multiple-ply sequences, which is more remote from said substrate than said first multiple-ply sequence, said portion includes the third ply of a next lower multiple-ply sequence.

2. The module of claim 1, wherein the portion of said module underlying each second ply of said plurality of multiple-ply sequences is substantially unimpairable by a second-ply-removing process for removing the second ply of a selected one of said plurality of multiple-ply sequences.

3. The module of claim 1, wherein each of said plurality of multiple-ply sequences, stacked over said at least one component and substrate, further includes a plurality of via holes extending therethrough, with each interior surface of said via holes being lined by said metal lands of each said multiple-ply sequence to establish a conductive link such that at least one metal lands film is electrically connected to said at least one electrical component.

4. The module of claim 3, further including an outer coating comprising an additional inorganic oxide film, said additional inorganic oxide film disposed on a top and all sides of said electrical interconnection structure and an additional dielectric polymer film disposed on a top of said additional inorganic oxide film;

the portion of said module underlying said outer coating being substantially unimpairable by a process for separately removing said additional polymer dielectric film and additional inorganic oxide film.

5. The module of claim 4, wherein said plurality of multiple-ply sequences underlie said outer coating;

the additional inorganic oxide film being substantially unimpairable by at least one substance for removing the additional dielectric polymer film in said outer coating by dissolution; and the metal lands and the dielectric polymer film in an underlying sequence of said plurality of multiple-ply sequences being substantially unimpairable by at least one substance for removing the additional inorganic oxide film in said outer coating by etching.

6. The module of claim 4, wherein said plurality of multiple-ply sequences underlie said outer coating;

the additional inorganic oxide film being substantially unimpairable by at least one substance for removing the additional dielectric polymer film in said outer coating by etching; and the metal lands and the dielectric polymer film in an underlying multiple-ply sequence of said plurality of multiple-ply sequences being substantially unimpairable by at least one substance for removing the additional inorganic oxide film in said outer coating by etching.

7. The module of claim 1, wherein:

said at least one component and said substrate including a plurality of metal interconnection pads disposed thereon;

said first multiple-ply sequence including a plurality of via holes extending therethrough, each interior surface of said via holes being lined by said metal lands of said first multiple-ply sequence to establish a conductive link between at least some metal lands of said first multiple-ply sequence and said at least one electrical component;

said remaining multiple-ply sequences each including a plurality of via holes extending therethrough, each interior surface of said via holes being lined by said metal lands of each corresponding remaining multiple-ply sequences to establish a conductive link such that at least some metal lands of each said remaining multiple-ply sequences are electrically connected to said at least one component interconnection pads and at least some of said metal lands of said multiple-ply sequences being electrically connected to at least one of said substrate interconnection pads.

8. The module of claim 7 wherein the metal lands of any one of said multiple-ply sequences is a power and ground providing multiple-ply sequence to provide electrical connections between power and ground external to said module and said at least one electrical circuit component.

9. The module of claim 8 wherein the first multiple-ply sequence is the power and ground providing multiple-ply sequence.

10. The module of claim 1, wherein the portion of said module underlying each third ply of said plurality of multiple-ply sequences, is substantially unimpairable by a third-ply-removing process for removing the third ply of a selected one of said plurality of multiple-ply sequences.

* * * * *